(12) United States Patent
Nakazawa

(10) Patent No.: US 9,431,291 B2
(45) Date of Patent: Aug. 30, 2016

(54) METHOD OF MAKING OPENINGS IN A SEMICONDUCTOR DEVICE WITH REDUCED RESIDUE BY TRANSFERRING LAYERS

(71) Applicant: KABUSHIKI KAISHA TOSHIBA, Tokyo (JP)

(72) Inventor: Keisuke Nakazawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/692,884

(22) Filed: Apr. 22, 2015

(65) Prior Publication Data

US 2016/0064272 A1 Mar. 3, 2016

Related U.S. Application Data

(60) Provisional application No. 62/043,062, filed on Aug. 28, 2014.

(51) Int. Cl.
| | | |
|---|---|---|
| *H01L 21/28* | (2006.01) | |
| *H01L 21/764* | (2006.01) | |
| *H01L 21/768* | (2006.01) | |
| *H01L 23/522* | (2006.01) | |
| *H01L 23/532* | (2006.01) | |

(52) U.S. Cl.
CPC ...... *H01L 21/76802* (2013.01); *H01L 21/7682* (2013.01); *H01L 23/5226* (2013.01); *H01L 23/53295* (2013.01); *H01L 23/5222* (2013.01); *H01L 23/5329* (2013.01)

(58) Field of Classification Search
CPC .............. H01L 21/76802; H01L 23/5226; H01L 21/7682; H01L 23/53295

USPC .................................................. 438/697–707
See application file for complete search history.

(56) References Cited

U.S. PATENT DOCUMENTS

| | | | |
|---|---|---|---|
| 8,629,035 B2 | 1/2014 | Nakazawa | |
| 8,835,279 B2 | 9/2014 | Nakazawa | |
| 2001/0046783 A1* | 11/2001 | Furusawa | H01L 21/31144 438/736 |
| 2013/0102124 A1* | 4/2013 | Nakazawa | H01L 21/764 438/422 |
| 2013/0115766 A1* | 5/2013 | Nakazawa | H01L 27/11524 438/594 |

FOREIGN PATENT DOCUMENTS

| | | |
|---|---|---|
| JP | 10-189566 | 7/1998 |
| JP | 11-233625 | 8/1999 |
| JP | 2007-150087 | 6/2007 |
| JP | 2011-165876 | 8/2011 |
| JP | 2012-195521 | 10/2012 |

* cited by examiner

*Primary Examiner* — Marcos D Pizarro Crespo
*Assistant Examiner* — Nelson Garces
(74) *Attorney, Agent, or Firm* — Finnegan, Henderson, Farabow, Garrett & Dunner LLP

(57) ABSTRACT

According to an embodiment, a method for manufacturing a semiconductor device includes transferring a continuous second layer, forming a third layer, and removing the second layer. The second layer is transferred onto a first layer. The first layer has a first opening. The second layer covers the first opening to form a first air gap. The third layer is formed on the first layer. The third layer has a second opening. The second opening is positioned on the first air gap. The second layer is removed through the second opening.

9 Claims, 15 Drawing Sheets

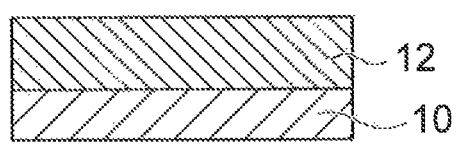
FIG. 1A
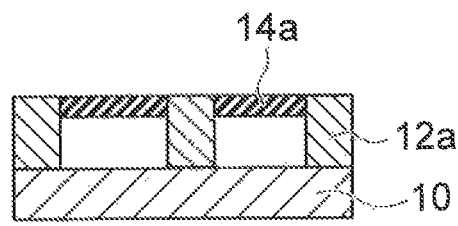
FIG. 1D
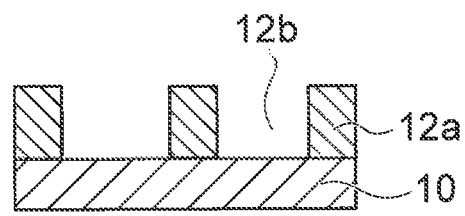
FIG. 1B
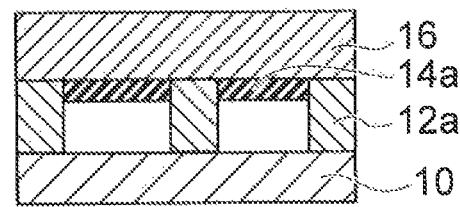
FIG. 1E
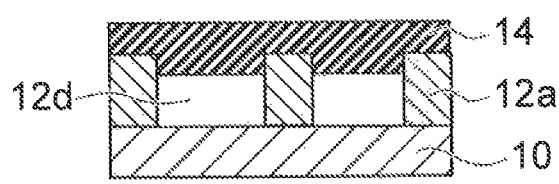
FIG. 1C
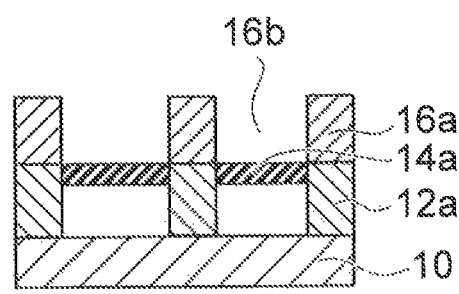
FIG. 1F
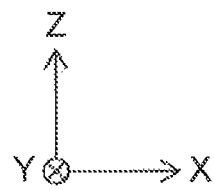

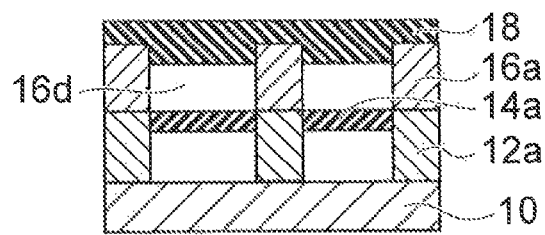
FIG. 2A
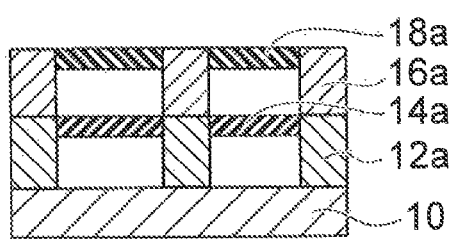
FIG. 2B
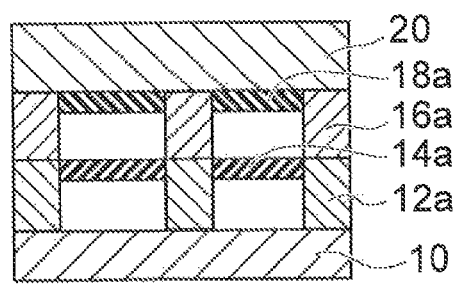
FIG. 2C
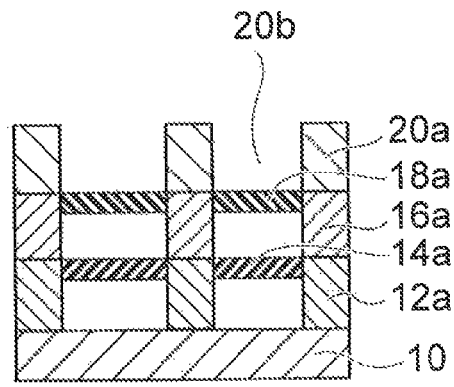
FIG. 2D
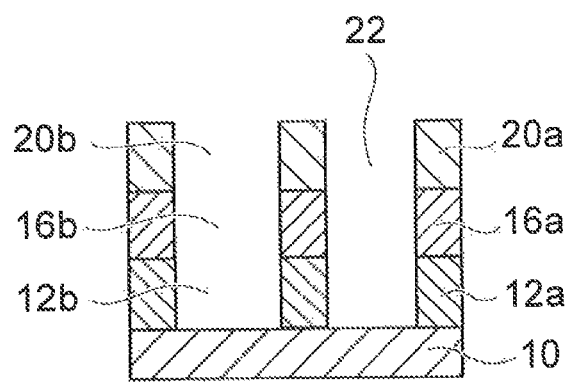
FIG. 2E
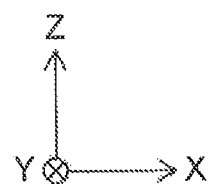

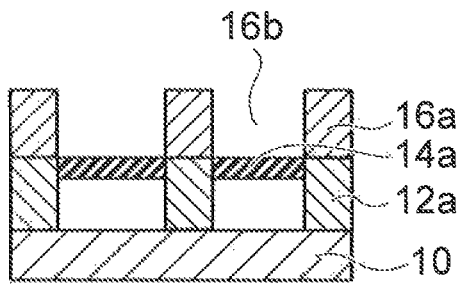
FIG. 3A
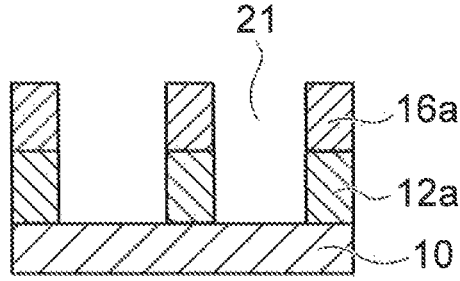
FIG. 3B
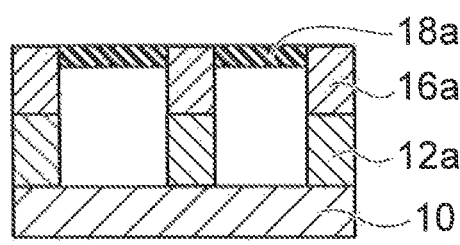
FIG. 3C
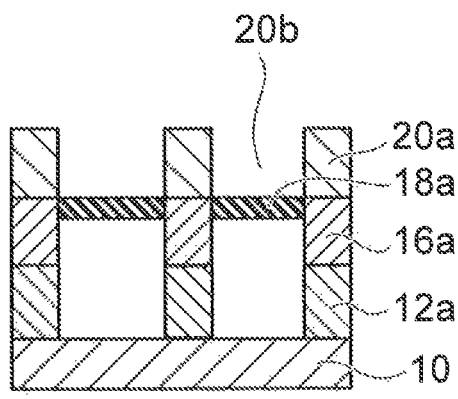
FIG. 3D
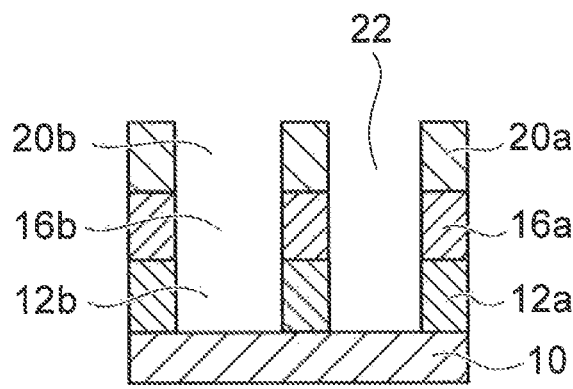
FIG. 3E
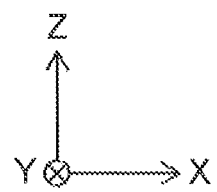

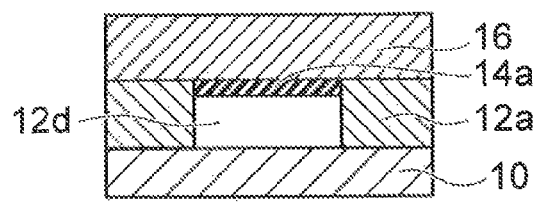
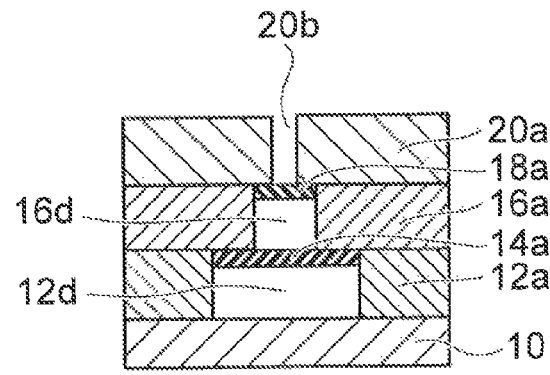
FIG. 4A                FIG. 4D
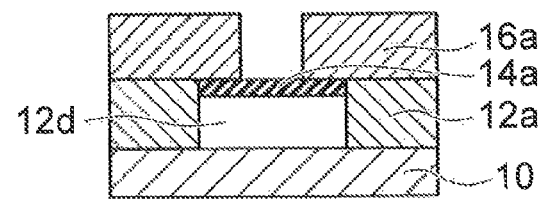
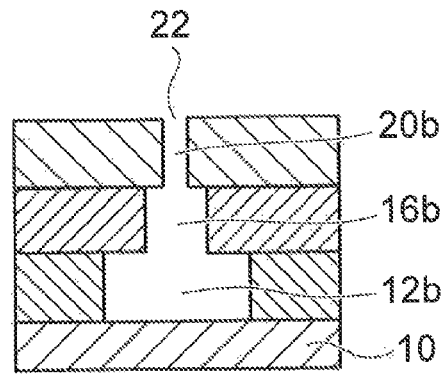
FIG. 4B                FIG. 4E
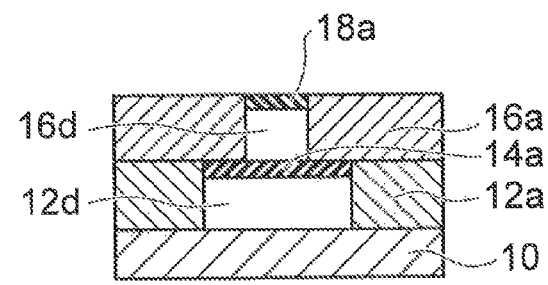
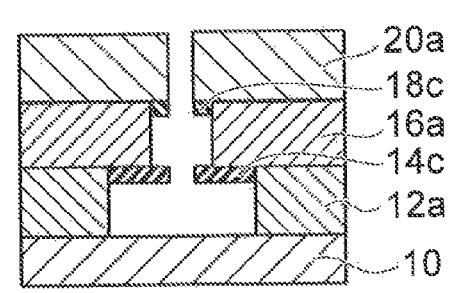
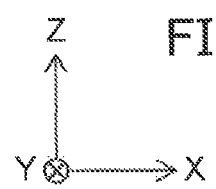
FIG. 4C                FIG. 4F

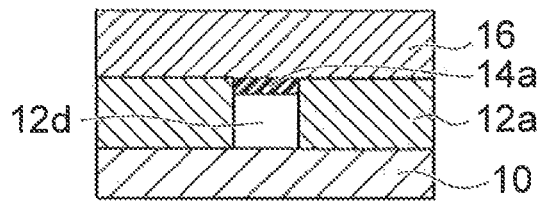
FIG. 5A
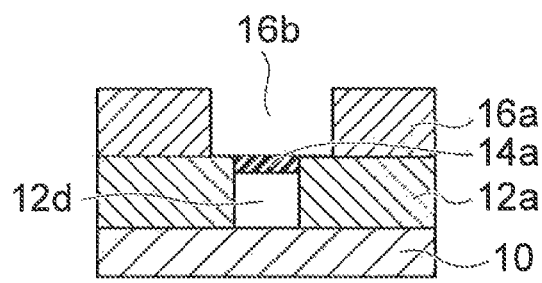
FIG. 5B
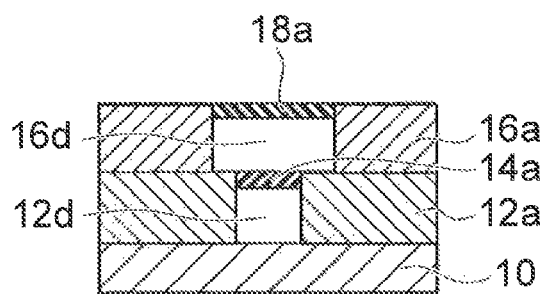
FIG. 5C
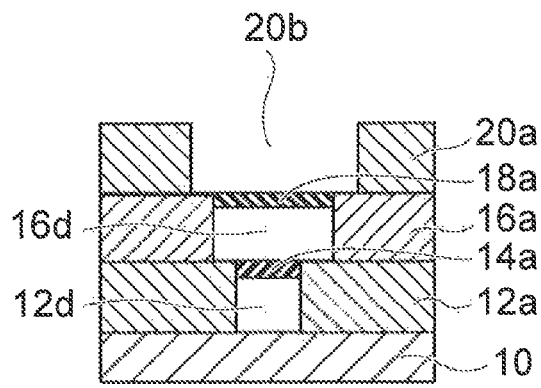
FIG. 5D
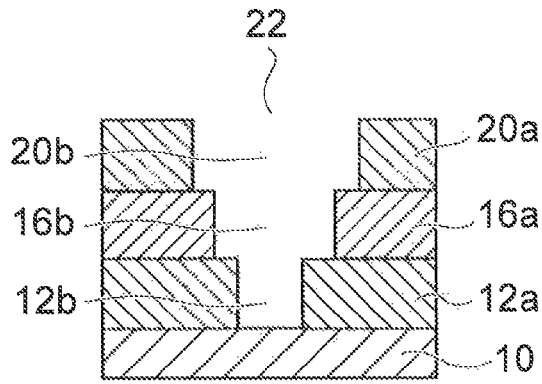
FIG. 5E
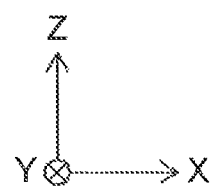

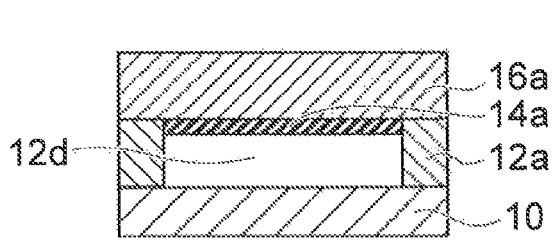
FIG. 6A
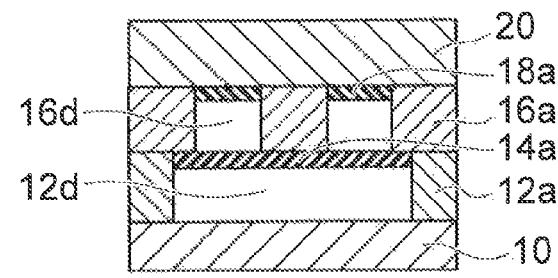
FIG. 6D
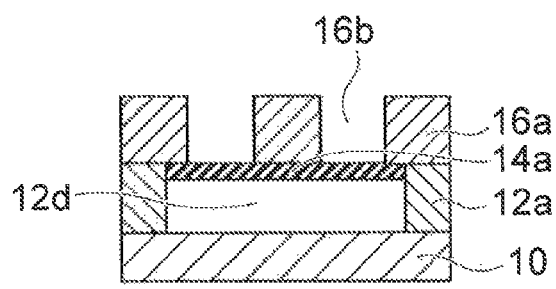
FIG. 6B
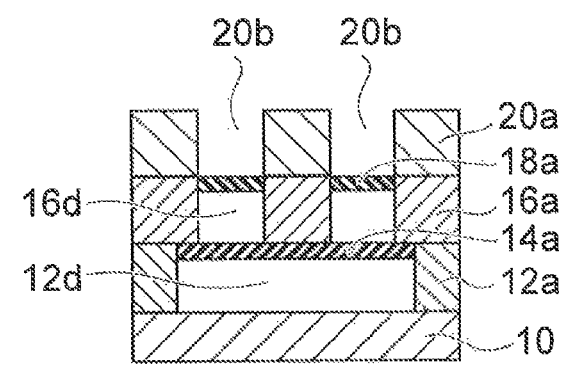
FIG. 6E
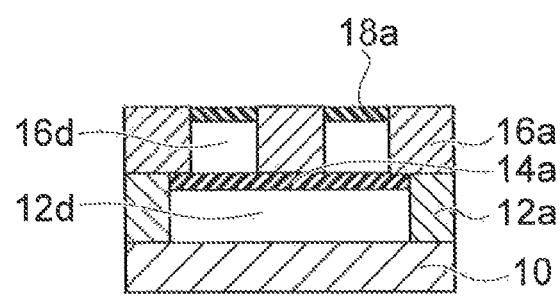
FIG. 6C
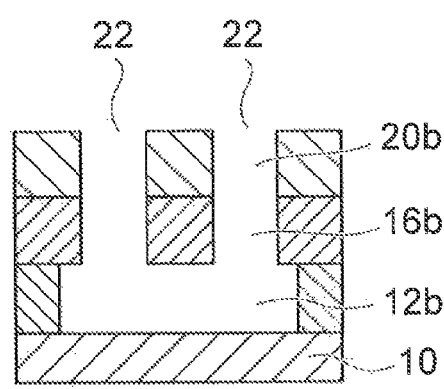
FIG. 6F
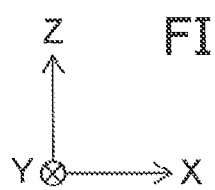

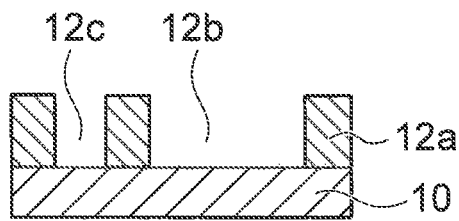
FIG. 7A
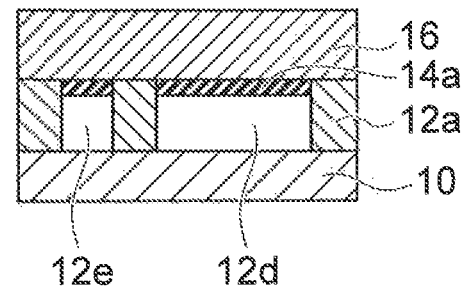
FIG. 7C
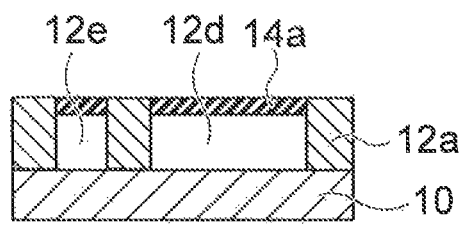
FIG. 7B
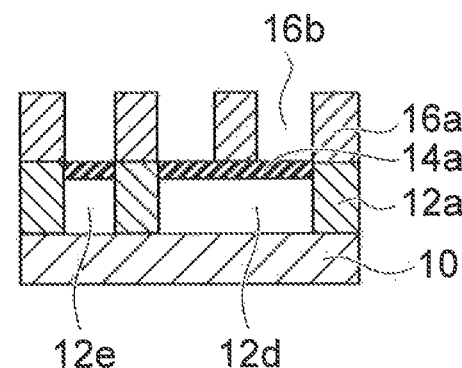
FIG. 7D
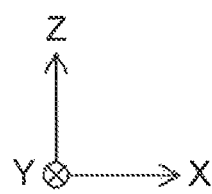

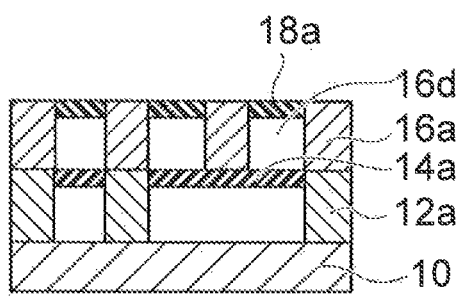
FIG. 8A
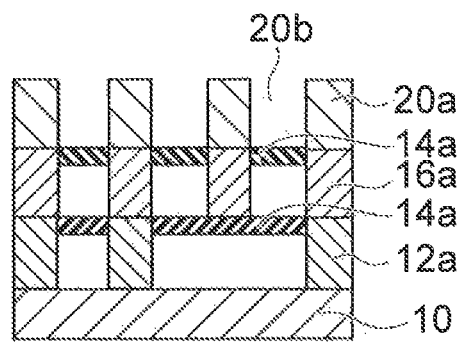
FIG. 8C
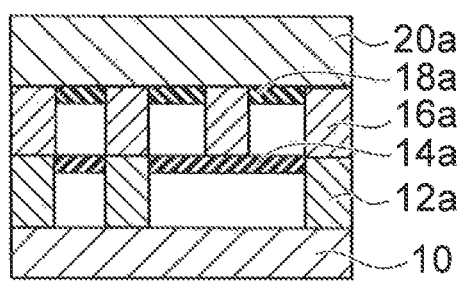
FIG. 8B
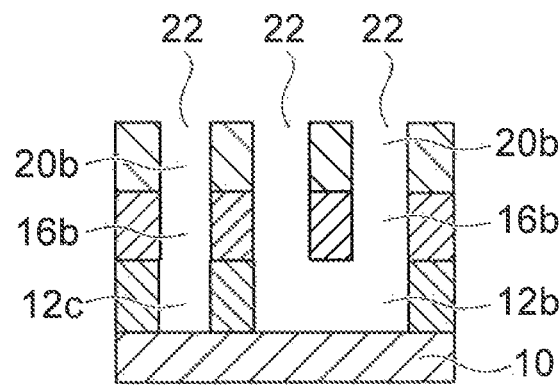
FIG. 8D
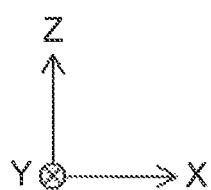

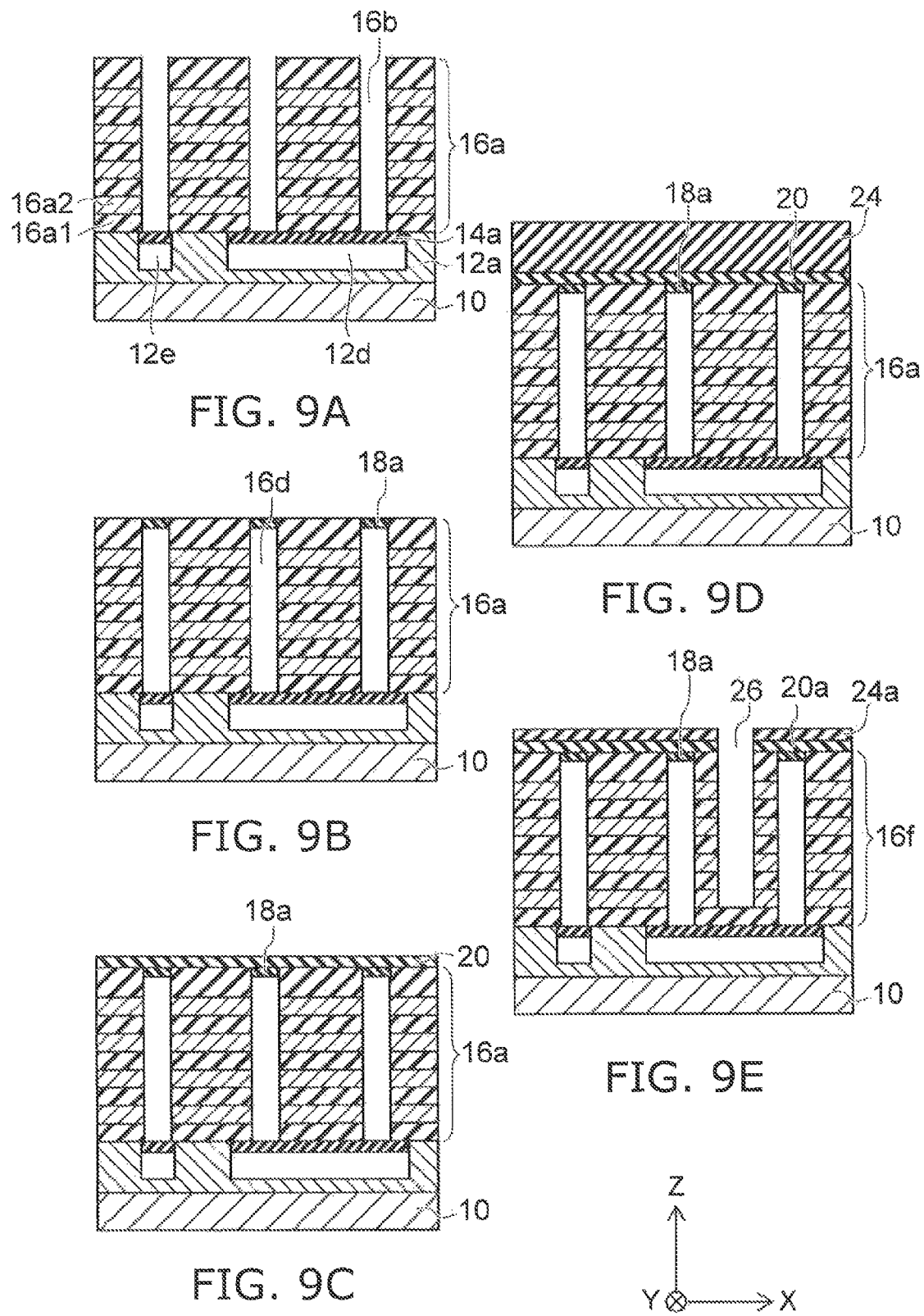

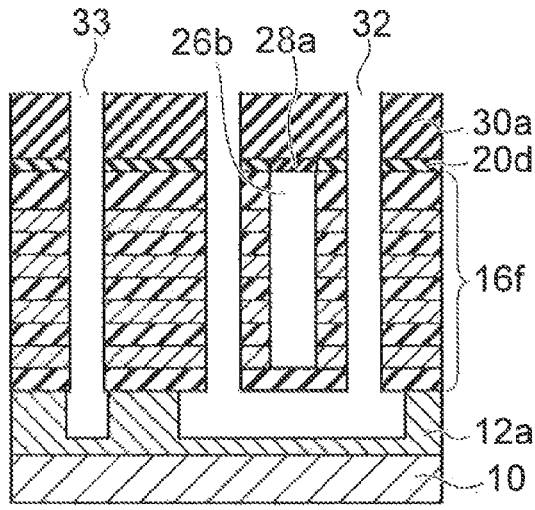
FIG. 11A
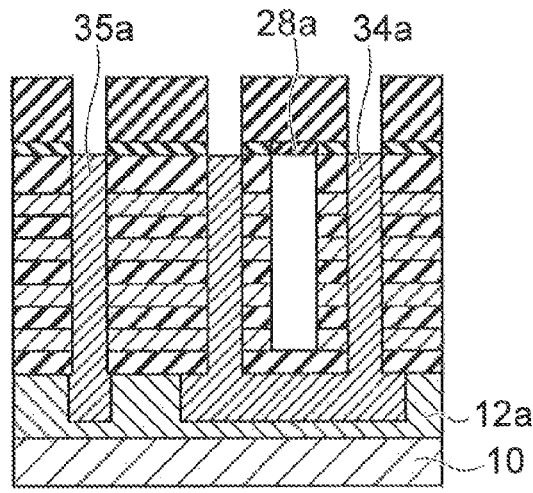
FIG. 11C
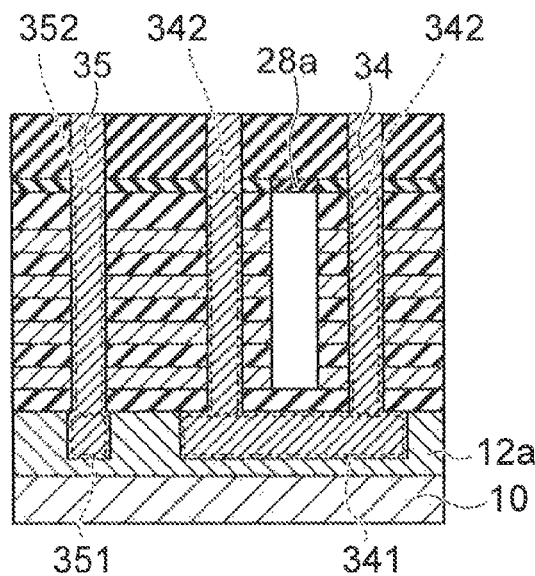
FIG. 11B
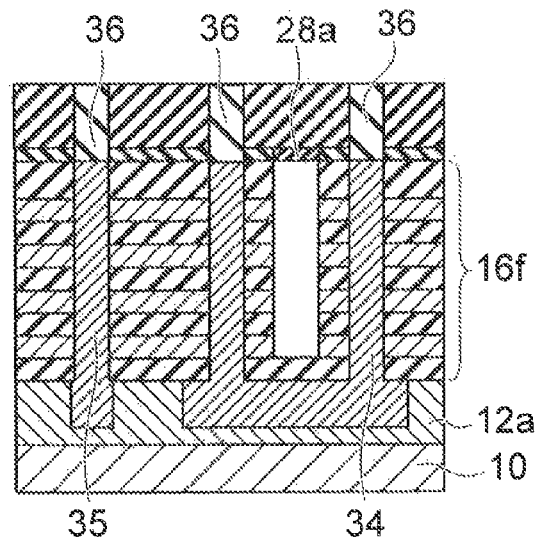
FIG. 11D
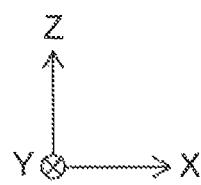

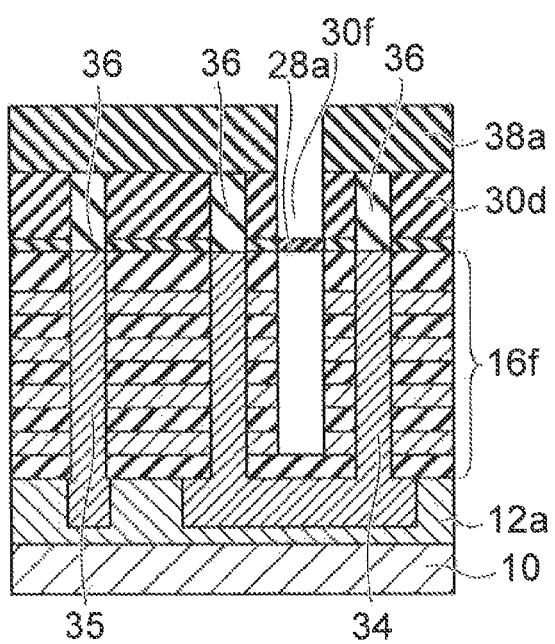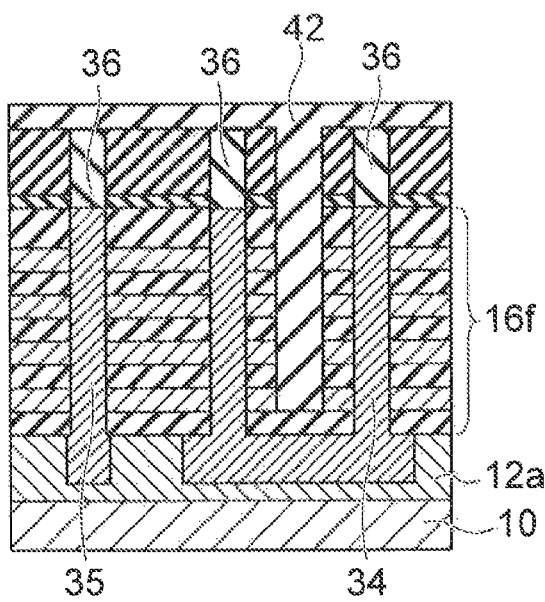
FIG. 12A  FIG. 12B
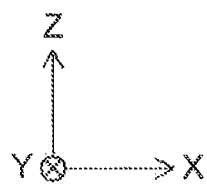

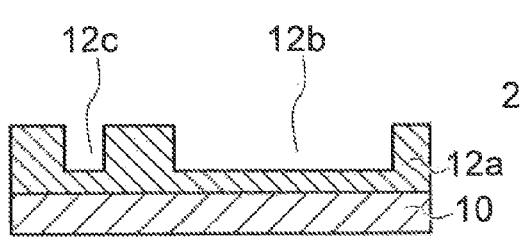
FIG. 14A
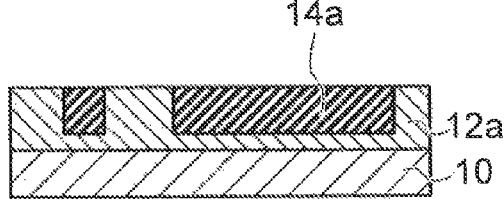
FIG. 14B
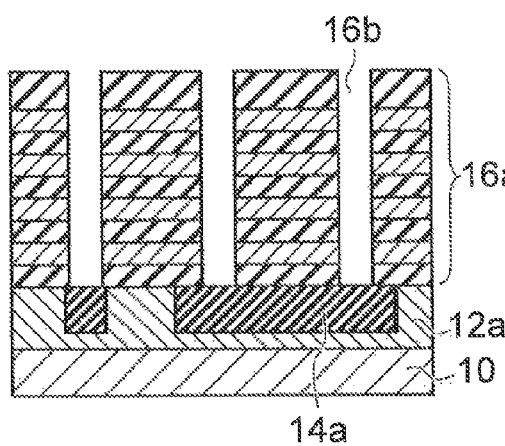
FIG. 14C
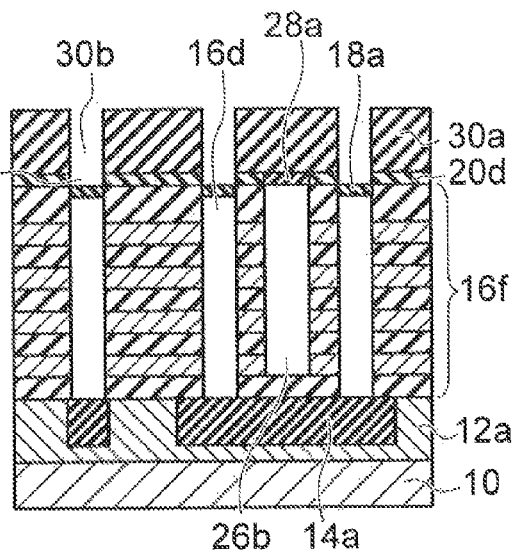
FIG. 14D
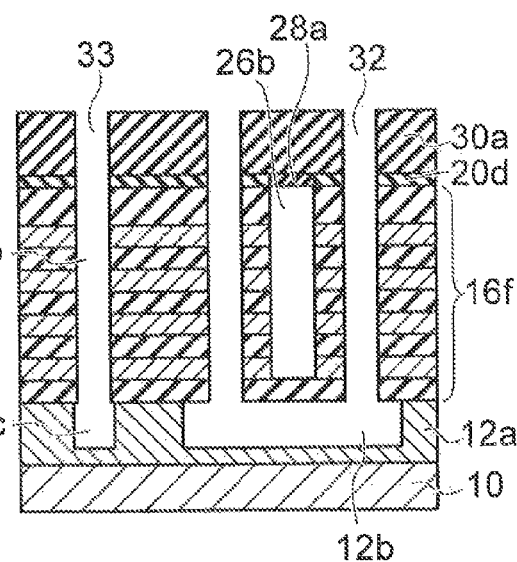
FIG. 14E
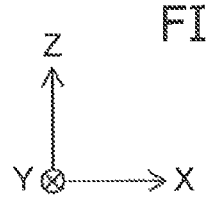

METHOD OF MAKING OPENINGS IN A SEMICONDUCTOR DEVICE WITH REDUCED RESIDUE BY TRANSFERRING LAYERS

CROSS-REFERENCE TO RELATED APPLICATIONS

This application is based upon and claims the benefit of priority from U.S. Provisional Patent Application 62/043,062, filed on Aug. 28, 2014; the entire contents of which are incorporated herein by reference.

In recent years, it has become necessary to make openings having high aspect ratios in the manufacturing processes of semiconductor devices to increase the element density, etc. It is desirable to reduce the residue in the opening interiors after making the openings having high aspect ratios.

BRIEF DESCRIPTION OF THE DRAWINGS

FIGS. 1A to 1F and FIGS. 2A to 2E are cross-sectional views of processes, showing a manufacturing method according to the first embodiment;

FIGS. 3A to 3E are cross-sectional views of processes, showing a manufacturing method according to a variation of the first embodiment;

FIGS. 4A to 4F are cross-sectional views of processes, showing a manufacturing method according to the second embodiment;

FIGS. 5A to 5E are cross-sectional views of processes, showing a manufacturing method according to the third embodiment;

FIGS. 6A to 6F are cross-sectional views of processes, showing a manufacturing method according to the fourth embodiment;

FIGS. 7A to 7D and FIGS. 8A to 8D are cross-sectional views of processes, showing a manufacturing method according to the fifth embodiment;

FIGS. 9A to 9E and FIGS. 10A to 10D are cross-sectional views of processes, showing a manufacturing method according to the sixth embodiment;

FIGS. 11A to 11D, FIGS. 12A and 12B, and FIGS. 13A and 13B are cross-sectional views of processes, showing a manufacturing method according to the seventh embodiment; and FIGS. 14A to 14E and FIG. 15 are cross-sectional views of processes, showing a manufacturing method according to the eighth embodiment.

DETAILED DESCRIPTION

Figure 10A:
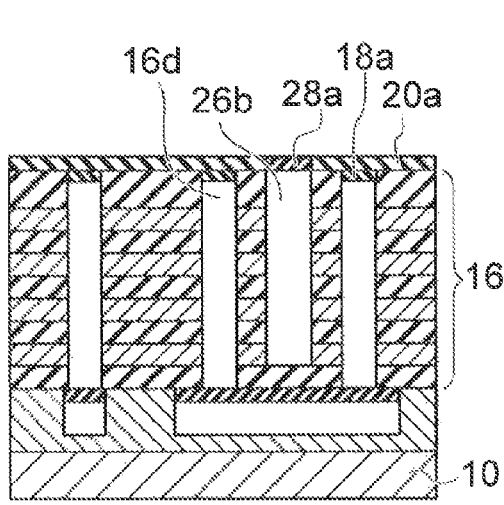

According to an embodiment, a method for manufacturing a semiconductor device includes transferring a continuous second layer, forming a third layer, and removing the second layer. The second layer is transferred onto a first layer. The first layer has a first opening. The second layer covers the first opening to form a first air gap. The third layer is formed on the first layer. The third layer has a second opening. The second opening is positioned on the first air gap. The second layer is removed through the second opening.

Embodiments of the invention will now be described with reference to the drawings.

The drawings are schematic; and the relationships between the thicknesses and widths of portions, the proportions of sizes between portions, etc., are not necessarily the same as the actual values thereof. Also, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

Arrows X, Y and Z in the respective drawings show three directions orthogonal to each other. For example, a direction shown by the arrow X (X-direction) and a direction shown by the arrow Y (Y-direction) are parallel with a main surface of a substrate 10. A direction shown by the arrow Z (Z-direction) shows a direction vertical to the main surface of the substrate 10.

First Embodiment

A first embodiment will be described using FIG. 1 and FIG. 2.

FIG. 1 and FIG. 2 are cross-sectional views of processes, showing a manufacturing method according to the first embodiment.

As shown in FIG. 1A, a first layer 12 is formed on the substrate 10. The substrate 10 is, for example, a semiconductor substrate. A conductive layer, a semiconductor layer, or an insulating layer can be used as the first layer 12. Or, the first layer 12 may be a stacked film of these layers.

As shown in FIG. 1B, a first layer 12a that has an opening 12b is formed by removing a portion of the first layer 12. The opening 12b pierces the first layer 12a. The first layer 12 is patterned using, for example, photolithography. A plurality of the opening 12 is formed in the X-direction. The opening 12b is a trench extending in one direction or a hole. Further a plurality of the opening 12 may be formed in the Y-direction.

As shown in FIG. 1C, a continuous second layer 14 is formed on the first layer 12a. A portion of the second layer 14 faces a portion of the substrate 10 in the Z-direction. Another portion of the second layer 14 and another portion of the substrate 10 overlap in the Z-direction with the first layer 12a interposed. The second layer 14 is formed by transferring a layer on the first layer 12a. The second layer 14 is formed continuously on the first layer 12a and on the opening 12b by, for example, spin coating film transfer and hot pressing (STP). A layer having good flatness can be obtained easily by using the STP. In the STP, the material of the second layer 14 is coated onto a film; and a layer is formed uniformly on the film by rotating the film. Then, the solvent is evaporated by heating the film within a range in which the layer is flowable. Subsequently, the thin layer is transferred onto the substrate by pressing the flipped substrate 10 onto the layer on the film and subsequently peeling the film. The substrate 10 is pressed onto the layer on the film, for example, under reduced pressure. At this time, the substrate 10 may be heated. An air gap 12d is formed by the opening 12b being covered with the second layer 14. An insulating material, for example, hydrogen silsesquioxane (HSQ), perhydropolysilazane (PHPS), or the like is used to form the second layer 14.

A portion of the second layer 14 is provided in a portion of the interior of the opening 12b of the first layer 12a. In other words, the portion of the second layer 14 and a portion of the first layer 12a overlap in the X-direction. The thickness in the Z-direction of the layer transferred onto the substrate 10 is, for example, 100 nm. The dimension in the Z-direction of the air gap 12d (the distance between the substrate 10 and the portion of the second layer 14 provided in the opening 12b) can be adjusted by adjusting the heating temperature of the film, the load when transferring to the substrate, etc.

As shown in FIG. 1D, a portion of the second layer 14 on the front surface side is removed. By this process, the second layer 14 other than the second layer 14 provided in the interior of the opening 12b is removed. In other words, the front surface of the first layer 12a is exposed by this process. Further, by this process, the height of the upper surface of a second layer 14a provided in the interior of the opening 12b and the height of the upper surface of the first layer 12a become equal. In other words, at least a portion the second layer 14a is positioned between a portion of the first layer 12a and another portion of the first layer 12a in the X-direction. The second layer 14 may remain on the first layer 12a without the front surface of the first layer 12a being completely exposed. For example, Chemical Mechanical Polishing (CMP) is used in the removal of the second layer 14. Or, the second layer 14 may be removed using a chemical liquid. Or, the second layer 14 may be removed by dry etching.

As shown in FIG. 1E, a third layer 16 is formed on the first layer 12a and on the second layer 14a. A layer that is similar to the first layer 12 can be used as the third layer 16.

As shown in FIG. 1F, similarly to the first layer 12, a third layer 16a that has an opening 16b is formed by removing a portion of the third layer 16. The opening 16b pierces the third layer 16a. The opening 16b is a trench extending in one direction or a hole. The opening 16b is made at a position corresponding to the air gap 12d of the first layer 12. In other words, the opening 16b is arranged with the air gap 12d in the Z-direction. The opening 16b corresponds to the opening 12b in the stacking direction of the first layer 12a and the third layer 16a.

On the third layer 16a as shown in FIG. 2A, similarly to the second layer 14, a fourth layer 18 is formed continuously on the third layer 16a and on the opening 16b. An air gap 16d is formed by the opening 16b being covered with the fourth layer 18. A material similar to the second layer 14 can be used as the material of the fourth layer 18. A portion of the fourth layer 18 is provided in the interior of the opening 16b of the third layer 16a.

As shown in FIG. 2B, a portion of the fourth layer 18 on the front surface side is removed. By this process, the fourth layer 18 other than the fourth layer 18 provided in the interior of the opening 16b is removed. In other words, the front surface of the third layer 16a is exposed by this process. Further, the height of the upper surface of the fourth layer 18a provided in the interior of the opening 16b and the height of the upper surface of the third layer 16a become equal by this process.

The fourth layer 18 may remain on the third layer 16a without the front surface of the third layer 16a being completely exposed. Similarly to the removal of the second layer 14, it is possible to use CMP, a method using a chemical liquid, or dry etching to remove the fourth layer 18.

As shown in FIG. 2C, a fifth layer 20 is formed continuously on the third layer 16a and on the fourth layer 18a. A layer that is similar to the first layer 12 can be used as the fifth layer 20.

As shown in FIG. 2D, similarly to the third layer 16, a fifth layer 20a that has an opening 20b is formed by removing a portion of the fifth layer 20. The opening 20b pierces the fifth layer 20a. The opening 20b is a trench extending in one direction or a hole. The opening 20b is made at a position corresponding to the air gap 16d of the third layer 16a. In other words, the opening 20b is arranged with the air gap 12d and air gap 16d in the Z-direction.

As shown in FIG. 2E, an opening 22 that is made of the opening 12b, the opening 16b, and the opening 20b is made by removing the second layer 14a covering the opening 12b and the fourth layer 18a covering the opening 16b. Wet etching or dry etching is used to remove the second layer 14a and the fourth layer 18a.

In addition to the processes described above, the following processes may be additionally implemented for the second layer 14 and the fourth layer 18.

In the case where PHPS is used as the material of the second layer 14, for example, heat treatment of the second layer 14 is performed in oxygen or in water vapor in a range of about 230° C. to 900° C. after the second layer 14 is formed. By this process, at least a portion of the second layer 14 can be changed to an oxide layer. Similarly, it is also possible to change at least a portion of the fourth layer 18 to an oxide layer. Or, after the second layer 14 is formed, the second layer 14 can be cured by changing at least a portion of the second layer 14 to a nitrided layer by performing heat treatment in a nitrogen atmosphere in a range of about 300° C. to 1000° C. Similarly, it is also possible to change at least a portion of the fourth layer 18 to a nitrided layer.

In the case where HSQ is used as the material of the second layer 14, heat treatment of the second layer 14 can be performed in oxygen, water vapor, or nitrogen atmosphere in a range of about 300° C. to 1000° C. after the second layer 14 is formed. By this process, at least a portion of the second layer 14 can be changed to an oxide layer. Similarly, it is also possible to change at least a portion of the fourth layer 18 to an oxide layer or a nitrided layer. Similarly, it is also possible to change at least a portion of the fourth layer 18 to an oxide layer or a nitrided layer.

By additionally performing these processes, for example, by nitriding the second layer 14 and the fourth layer 18 in the case where oxide layers are included in the first layer 12a and/or the third layer 16a, it becomes easy to selectively remove the second layer 14 and the fourth layer 18 when removing the second layer 14 and the fourth layer 18.

Or, by oxidizing the second layer 14 and the fourth layer 18 in the case where nitrided layers are included in the first layer 12a and/or the third layer 16a, it becomes easy to selectively remove the second layer 14 and the fourth layer 18 when removing the second layer 14 and the fourth layer 18.

In the case where the materials of the second layer 14 and the fourth layer 18 are oxide films, the second layer 14 and the fourth layer 18 can be removed by, for example, a hydrofluoric acid-based chemical liquid. In the case where the materials of the second layer 14 and the fourth layer 18 are nitride films, the second layer 14 and the fourth layer 18 can be removed by, for example, a phosphoric acid-based chemical liquid.

A method for manufacturing the semiconductor device according to the embodiment will now be described.

Here, as a comparative example for the embodiment, the case is considered where the second layer 14 is filled into the entire interior of the opening 12b, and the fourth layer 18 is filled into the entire interior of the opening 16b. In such a case, more material must be removed when removing the layers provided in the interiors of the opening 12b and the opening 16b than in the case where the layers provided in only a portion of the interiors of the opening 12b and the opening 16b are removed. As a result, residue occurs easily in the interiors of the openings after removing the material provided in the interiors of the opening 12b and the opening 16b. In particular, in the case where the aspect ratio of the opening 22 is high, it is difficult to remove the material positioned at the bottom portion vicinity of the opening 22.

However, by providing the second layer 14 and the fourth layer 18 to form air gaps for each of openings as in the embodiment, it is possible to reduce the volume of the material that is removed. Therefore, even in the case where the aspect ratio of the opening 22 is high, it is possible to remove the material in the interior of the opening 22 more easily. Also, because the volume of the material that must be removed from the opening interior is reduced, the removal of the material in the opening interior can be performed with a shorter processing time.

Also, compared to the comparative example described above, because the second layer 14 is provided only at a portion of the opening interior of the first layer 12a, the contact surface area between the second layer 14 and the side wall of the opening 12b can be reduced. Similarly, compared to the comparative example described above, because the fourth layer 18 is provided only at a portion of the opening interior of the third layer 16a, the contact surface area between the fourth layer 18 and the side wall of the opening 16b can be reduced. Therefore, even in the case where the material of the first layer 12a reacts easily with the material of the second layer 14, the element characteristics can be improved because the contact surface area between the materials can be reduced. Similarly, even in the case where the material of the third layer 16a reacts easily with the material of the fourth layer 18, the element characteristics can be improved because the contact surface area between the materials can be reduced.

Although the removal of the second layer 14a and the removal of the fourth layer 18a are performed simultaneously in one process in the description described above, these layers may be removed in separate processes. The number of processes can be reduced by removing the second layer 14a and the fourth layer 18a simultaneously in one process.

In the description described above, the opening 22 is made by removing the second layer 14a and the fourth layer 18a after making the opening 20b in the fifth layer 20. However, this is not limited thereto; and an opening having a high aspect ratio may be made by repeating the processes from FIG. 2A to FIG. 2D. An opening having a higher aspect ratio can be made by repeating the formation of the air gaps and finally removing the films covering each air gap.

(Variation of the First Embodiment)

A variation of the first embodiment will be described using FIG. 3.

FIGS. 3A to 3E are cross-sectional views of processes, showing a manufacturing method according to a variation of the first embodiment.

Processes that are similar to the processes shown in FIGS. 1A to 1F are implemented; and the first layer 12a, the air gap 12d, the second layer 14a, and the third layer 16a are formed on the substrate 10 as shown in FIG. 3A.

As shown in FIG. 3B, the second layer 14a is removed. By this process, opening 21 that is made of the opening 12b and the opening 16b is formed.

As shown in FIG. 3C, a fourth layer 18a that covers the opening 21 is formed.

As shown in FIG. 3D, a fifth layer 20a that has the opening 20b is formed on the third layer 16a.

As shown in FIG. 3E, the opening 22 that is made of the opening 20b and the opening 21 is formed by removing the fourth layer 18a.

According to the variation, in the case where an opening having a high aspect ratio is formed, it is possible to reduce the amount of the material remaining in the opening interiors as well as the first embodiment.

Second Embodiment

A second embodiment will be described using FIGS. 4A to 4F.

FIGS. 4A to 4F are cross-sectional views of processes, showing a manufacturing method according to the second embodiment.

Processes that are similar to the processes shown in FIGS. 1A to 1E are implemented; and the first layer 12a, the air gap 12d, the second layer 14a, and the third layer 16 are formed on the substrate 10 as shown in FIG. 4A. The air gap 12d may be multiply formed in the X-direction and the Y-direction.

As shown in FIG. 4B, the third layer 16a that has the opening 16b is formed by removing a portion of the third layer 16. The third layer 16a has an opening 16b having a width that is narrower than the width of the air gap 12d. The width is, for example, the dimension in a direction parallel to a major surface of the substrate 10. In other words, the width may be a dimension in the X-direction. A portion of the second layer 14a and the third layer 16a overlap in the Z-direction. Another portion of the second layer 14a and the third layer 16a do not overlap in the Z-direction.

As shown in FIG. 4C, the fourth layer 18a is formed; and the air gap 16d is formed.

As shown in FIG. 4D, the fifth layer 20a that has the opening 20b is formed on the third layer 16a and on the fourth layer 18a. The opening 20b has a width that is narrower than the width of the air gap 16d.

As shown in FIG. 4E, the opening 22 that is made of the opening 12b, the opening 16b, and the opening 20b is made by removing the second layer 14a covering the opening 12b and the fourth layer 18a covering the opening 16b.

According to the embodiment, a structural body is made in which the widths of the openings of the layers formed at the upper portion are narrower than the widths of the air gaps (the openings) formed at the lower portion. Also, in such a case as well, the occurrence of the residue can be suppressed favorably because the amount of the material that is removed is small.

The structure may become a structure such as that shown in FIG. 4F in the case where dry etching having high anisotropy is used when removing the second layer 14a covering the opening 12b and the fourth layer 18a covering the opening 16b from the structure of FIG. 4D. In other words, the portion of the second layer 14a that faces the opening 16b and the portion of the fourth layer 18a that faces the opening 20b are removed; and a second layer 14c and a fourth layer 18c remain inside the openings. At this time, at least a portion of the second layer 14c and the third layer 16a overlap in the Z-direction. At least a portion of the fourth layer 18c and the fifth layer 20a overlap in the Z-direction. However, even in such a case, by using the embodiment, compared to the case where the material is filled into the entire opening interiors, it is possible to reduce the amount of the material remaining in the opening interiors.

Third Embodiment

A third embodiment will be described using FIGS. 5A to 5E.

FIGS. 5A to 5E are cross-sectional views of processes, showing a manufacturing method according to the third embodiment.

Processes similar to the processes shown in FIGS. 1A to 1E are implemented; and the first layer 12a, the air gap 12d, the second layer 14a, and the third layer 16 are formed on the substrate 10 as shown in FIG. 5A. The air gap 12d may be multiply formed.

As shown in FIG. 5B, the third layer 16a that has the opening 16b is formed by removing a portion of the third layer 16. The third layer 16a has an opening 16b having a width that is wider than the width of the air gap 12d. At this time, a portion of the first layer 12a may be exposed.

As shown in FIG. 5C, the fourth layer 18a is formed; and the aft gap 16d is formed. At this time, a portion of the fourth layer 18a may face a portion of the first layer 12a in the Z-direction. Another portion of the fourth layer 18a may face the second layer 14a.

As shown in FIG. 5D, the fifth layer 20a that has the opening 20b is formed on the third layer 16a and on the fourth layer 18a. The opening 20b has a width that is wider than the width of the air gap 16d.

As shown in FIG. 5E, the opening 22 that is made of the opening 12b, the opening 16b, and the opening 20b is formed by removing the second layer 14a covering the opening 12b and the fourth layer 18a covering the opening 16b.

According to the embodiment, a structural body is made in which the widths of the openings of the layers formed at the upper portion are wider than the widths of the air gaps (the openings) formed at the lower portion. Also, in such a case as well, the occurrence of the residue can be suppressed favorably because the amount of the material that is removed is small.

Fourth Embodiment

A fourth embodiment will be described using FIGS. 6A to 6F.

FIGS. 6A to 6F are cross-sectional views of processes, showing a manufacturing method according to the fourth embodiment.

Processes similar to the processes shown in FIGS. 1A to 1E are implemented; and the first layer 12a, the air gap 12d, the second layer 14a, and the third layer 16 are formed on the substrate 10 as shown in FIG. 6A.

As shown in FIG. 6B, the third layer 16a that has the opening 16b is formed by removing a portion of the third layer 16. At this time, multiple openings 16b are made for one air gap 12d. The widths of the openings 16b are narrower than the width of the air gap 12d. A portion of the third layer 16a is provided on the second layer 14a.

As shown in FIG. 6C, the fourth layer 18a is formed; and the air gap 16d is formed. One air gap 12d is arranged with multiple air gaps 16d in the Z-direction. The fourth layer 18a may be divided multiply as shown in FIG. 6C. Or, continuous fourth layer 18a may be provided by disposing a portion of the fourth layer 18a on the third layer 16a.

As shown in FIG. 6D, the fifth layer 20 is formed on the third layer 16a and on the fourth layer 18a.

As shown in FIG. 6E, the fifth layer 20a that has the opening 20b is formed by removing a portion of the fifth layer 20. Multiple openings 20b may be made for one air gap 16d.

As shown in FIG. 6F, the opening 22 that is made of the opening 20b, the opening 16b, and a portion of the opening 12b is made by removing the second layer 14a covering the opening 12b and the fourth layer 18a covering the opening 16b.

According to the embodiment, even in the case where multiple openings are made for one air gap, the occurrence of the residue can be suppressed favorably because the amount of the material that is removed is small.

Fifth Embodiment

A fifth embodiment will be described using FIGS. 7A to 7D and FIGS. 8A to 8D.

FIGS. 7A to 7D and FIGS. 8A to 8D are cross-sectional views of processes, showing a manufacturing method according to the fifth embodiment.

As shown in FIG. 7A, the first layer 12 is formed on the substrate 10; and the first layer 12a that has openings is formed by removing a portion of the first layer 12. At this time, an opening 12c that has a first width and the opening 12b that has a second width are made in the first layer 12a. The second width is wider than the first width.

As shown in FIG. 7B, the second layer 14a that covers the openings 12b and 12c is formed on the first layer 12a. The air gaps 12d and 12e are formed by the second layer 14a. The air gap 12e has the first width; and the air gap 12d has the second width.

As shown in FIG. 7C, the third layer 16 is formed on the first layer 12a and on the second layer 14a.

As shown in FIG. 7D, the third layer 16a that has the opening 16b is formed by removing a portion of the third layer 16. At this time, one opening 16b is made for one air gap 12e; and multiple openings 16b are made for one air gap 12d.

As shown in FIG. 8A, the fourth layer 18a is formed; and the air gap 16d is formed. Thereby, one air gap 16d is formed for one air gap 12e; and multiple air gaps 16d are formed for one air gap 12d. In other words, one air gap 12e is arranged with one air gap 16d in the Z-direction. One air gap 12d is arranged with the multiple air gaps 16d in the Z-direction.

As shown in FIG. 8B, the fifth layer 20a is formed on the third layer 16a and on the fourth layer 18a.

As shown in FIG. 8C, the fifth layer 20 that has the opening 20b is formed by removing a portion of the fifth layer 20. Multiple openings 20b may be made for one air gap 16d.

As shown in FIG. 8D, the second layer 14a that covers the opening 12b is removed; and the fourth layer 18a that covers the opening 16b is removed. At this time, the opening 22 that is made of the opening 20b, the opening 16b, and a portion of the opening 12b is made; and an opening 23 that is made of the opening 12c, the opening 16b, and the opening 20b is made.

According to the embodiment, a structural body can be made to have an opening having a high aspect ratio and a structure in which openings having high aspect ratios are linked to each other at the bottom portions.

Sixth Embodiment

A sixth embodiment will be described using FIGS. 9A to 9E and FIGS. 10A to 10D.

FIGS. 9A to 9E and FIGS. 10A to 10E are cross-sectional views of processes, showing a manufacturing method according to the sixth embodiment.

Processes similar to the processes shown in FIGS. 7A to 7D are implemented; and the first layer 12a, the air gaps 12d and 12e, the second layer 14a, and the third layer 16a that has the opening 16b are formed on the substrate 10 as shown in FIG. 9A. In the embodiment, the third layer 16a has a structure in which a layer 16a1 and a layer 16a2 are stacked alternately. A conductive material, a semiconductor material, or an insulating material can be used as the materials of the layers 16a1 and 16a2. The layer 16a1 is, for example, an insulating layer and includes silicon oxide. The layer 16a2 is, for example, a conductive layer and includes polysilicon.

As shown in FIG. 9B, the air gap 16d is formed by covering the opening 16b with the fourth layer 18a. At this time, one air gap 16d is formed for one air gap 12e; and multiple air gaps 16d are formed for one air gap 12d. In other words, one air gap 12e is arranged with one air gap 16d in the Z-direction. One air gap 12d is arranged with the multiple air gaps 16d in the Z-direction.

As shown in FIG. 9C, the fifth layer 20 is formed on the third layer 16a and the fourth layer 18a. The fifth layer 20 may function as a layer for protecting the fourth layer 18a.

As shown in FIG. 9D, a mask layer 24 is formed on the fifth layer 20. The mask layer 24 is patterned using, for example, photolithography.

As shown in FIG. 9E, an opening 26 is made in the fifth layer 20 and the third layer 16a using a patterned mask layer 24a. The opening 16b pierces the third layer 16f. Conversely, the opening 26 does not pierce the third layer 16f. In other words, a portion of the third layer 16f is positioned between the second layer 14a and the opening 26. Also, the opening 26 is provided to be separated from the air gap 12d (the second layer 14a) in the X-direction. For example, the opening 26 is positioned between the multiple air gaps 16d provided to correspond to the one air gap 12d. In other words, the opening 26 is arranged with a plurality of the air gap 16d in the X-direction and positioned between these air gaps 16d.

As shown in FIG. 10A, a sixth layer 28a that covers the opening 26 is formed. Thereby, an air gap 26b that is positioned between the adjacent air gaps 16d is formed. At this time, the air gap 16d (the opening 16b) and the air gap 26b extend in the first direction; and the air gap 26b is arranged with the air gap 12d in the first direction. The first direction is, for example, a direction perpendicular to the major surface of the substrate 10. That is, the first direction may be the Z-direction. The air gap 26b and the air gap 12d being arranged in the first direction means that the air gap 26b and the air gap 12d appear to overlap as viewed from the first direction. At least a portion of the sixth layer 28a that covers the opening 26 and at least a portion of the fourth layer 18a that covers the opening 16b are positioned at different heights. For example, the mask layer 24a is removed when forming the sixth layer 28a by polishing. The sixth layer 28a may be formed by a method similar to those of the second layer 14a and/or the fourth layer 18a. The sixth layer 28a may include a material similar to those of the second layer 14a and/or the fourth layer 18a.

Figure 10B:
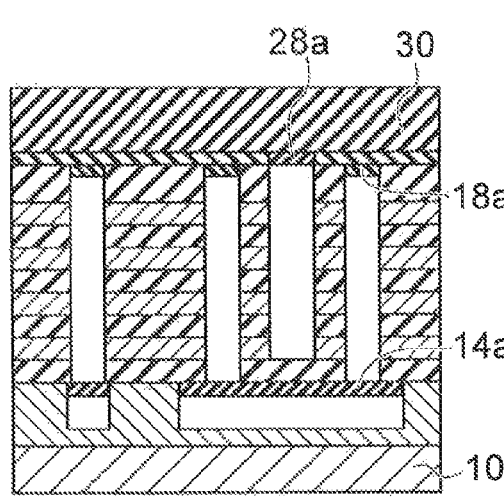

A seventh layer 30 is formed as shown in FIG. 10B. A conductive layer, a semiconductor layer, or an insulating layer can be used as the seventh layer 30.

Figure 10C:
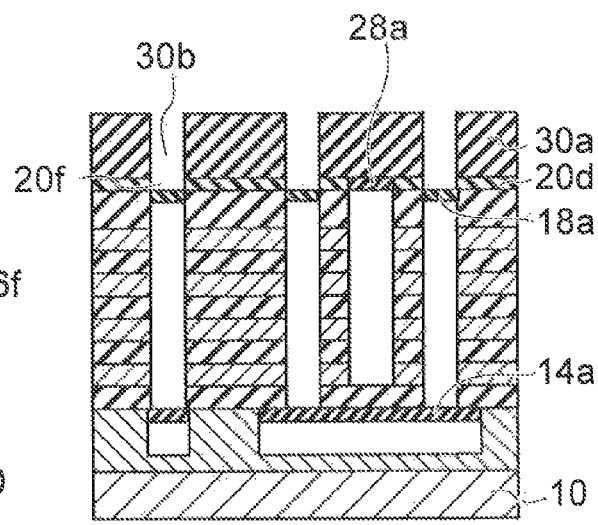

As shown in FIG. 10C, a seventh layer 30a that has an opening 30b is formed by removing a portion of the seventh layer 30. At this time, a fifth layer 20d that has an opening 20f is formed simultaneously by removing a portion of the fifth layer 20a.

Figure 10D:
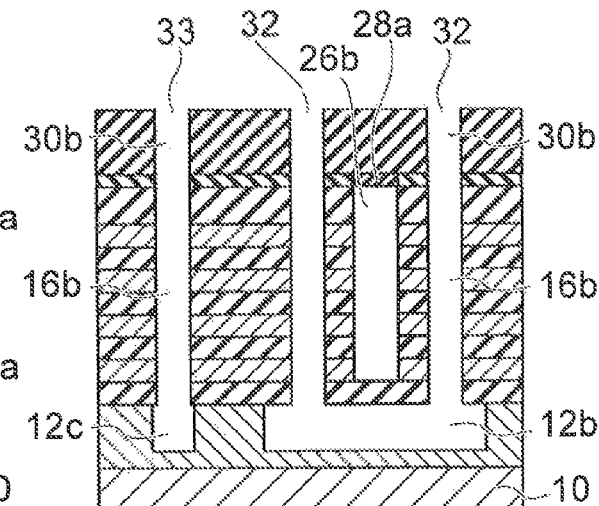

As shown in FIG. 10D, the second layer 14a and the fourth layer 18a are removed. Thereby, an opening 32 that is made of the opening 30b, the opening 20f, and a portion of the opening 12b is made; and an opening 33 that is made of the opening 12c, the opening 20f, and the opening 30b is made.

According to the embodiment, it is possible to make multiple openings for one air gap and form an air gap between the multiple openings while suppressing the occurrence of the residue.

Seventh Embodiment

A seventh embodiment will be described using FIGS. 11A to 11D, FIGS. 12A and 12B, and FIGS. 13A and 13B.

FIGS. 11A to 11D, FIGS. 12A and 12B, and FIGS. 13A and 13B are cross-sectional views of processes, showing a manufacturing method according to the seventh embodiment.

The embodiment is an example of a semiconductor manufacturing process for the structural body having the opening 32 formed by the sixth embodiment.

Processes similar to the processes shown in FIG. 9 and FIG. 10 are implemented; and the structural body having the openings 32 and 33 is made as shown in FIG. 11A.

As shown in FIG. 11B, filled portions 34 (a third layer) and 35 are formed by filling a prescribed material into the openings 32 and 33. A conductive material, a semiconductor material, or an insulating material can be used as the materials of the filled portions 34 and 35. Or, the filled portions 34 and 35 may be formed by stacking layers made of mutually-different materials. Each of the layers may be formed along inner walls of the opening 32 and the opening 33. Different materials may be filled into the openings 12b and 12c of the first layer 12a and the opening 16b of the third layer 16a. The filled portion 34 includes a filled portion 341 (a first filled portion or a first portion) that is made of a first material filled into the opening 12b (a first opening), and a filled portion 342 (a second filled portion or a second portion) that is made of a second material filled into the opening 16b (a second opening). The filled portion 35 includes a filled portion 351 that is made of the first material filled into the opening 12c and a filled portion 352 that is made of the second material filled into the opening 16b. The filled portion 342 contacts the filled portion 341. The filled portion 352 contacts the filled portion 351. The first material of the filled portions 341 and 351 may be the same as the second material of the filled portions 342 and 352.

In an example described in FIG. 11B, the filled portion 341 and the filled portion 351 are surrounded by a portion of the first layer 12a along the X-Y plane. The filled portion 342 is multiply provided in the X-direction (a second direction). The filled portion 352 and each of the filled portions 342 are surrounded by the third layer 16f along the X-Y plane. The filled portion 341 is separated from the air gap 26b in the Z-direction. A portion of the filled portion 341 is arranged with the air gap 26b in the Z-direction.

The air gap 26b is separated from the first filled portion 341 in the first direction. For example, the filled portions 34 and 35 have a structure in which a film made of an insulating material and a film made of a conductive material are stacked in order from the side walls of the openings 32 and 33.

As shown in FIG. 11C, filled portions 34a and 35a are formed by removing portions of the filled portions 34 and 35 on the front surface side.

As shown in FIG. 11D, a capping layer 36 is formed in the portions where the filled portions 34 and 35 are removed. The capping layer 36 may function to protect the filled portions 34a and 35a.

A mask layer 38a is formed on the seventh layer 30a using photolithography. As shown in FIG. 12A, a seventh layer 30d that has an opening 30f is formed using the mask layer 38a.

An opening 40 is made by removing the sixth layer 28a.

As shown in FIG. 12B, an insulating unit 42 is formed by filling an insulating material into the opening 40.

As described above, the semiconductor device according to the embodiment includes the first layer and the second layer. The first layer includes the first filled portion that is the first material filled into the first opening. The second layer includes the multiple second filled portions made of the second material filled into the multiple second openings, and the air gap provided between the multiple second filled portions. In the second layer, the second filled portions and the air gap extend in the first direction. Multiple second filled portions are provided to contact one first filled portion. The air gap is provided to be separated from the first filled portion in the first direction. The air gap is arranged with the first filled portion in the first direction.

By implementing the method of the semiconductor manufacturing apparatus according to the embodiment using the manufacturing method according to the sixth embodiment, it is possible to make a semiconductor device in which the residue inside the holes is reduced and the desired material is filled more favorably.

Figure 13A:
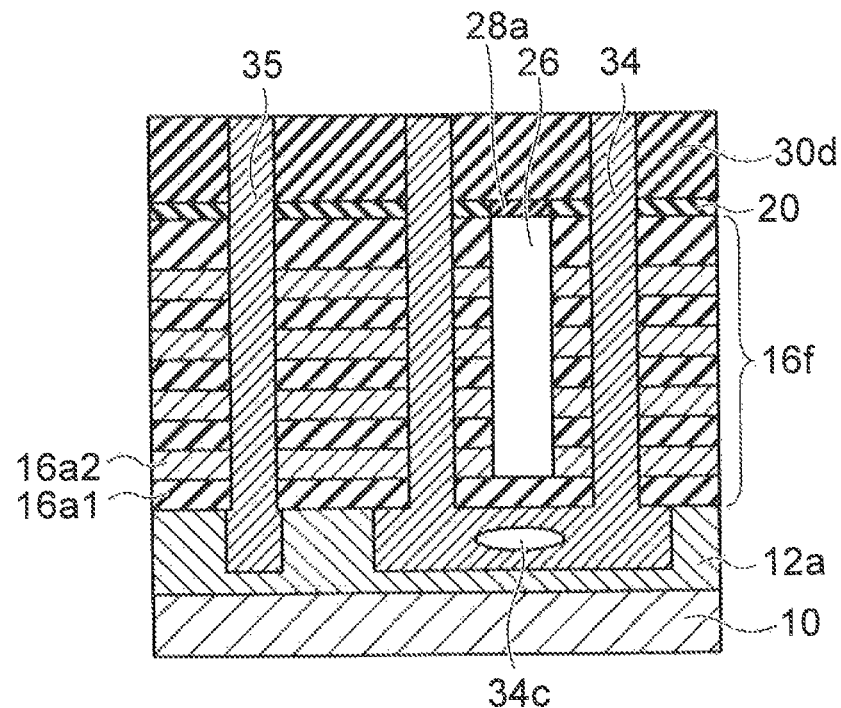

There may be cases where the material cannot be filled into the entire interior of the opening 32 according to the aspect ratio of the opening 16b, the width of the opening 12b, and the positional relationship between the opening 12b and the opening 16b. In such a case, for example, as shown in FIG. 13A, a gap 34c occurs at the position of the opening 12b in the filled portion 34. The gap 34c may be arranged with the air gap 26b in the first direction.

Figure 13B:
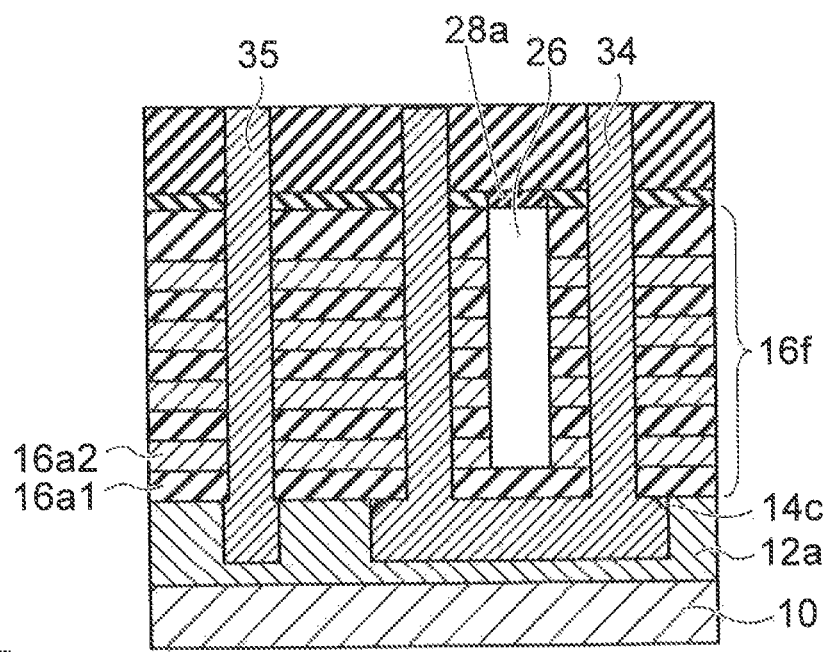

Or, according to the removal method of the second layer 14a when making the openings 32 and 33, there may be cases where the second layer 14a cannot be removed completely. In such a case, for example, the second layer 14c may remain at the corner between the first layer 12a and the third layer 16 as shown in FIG. 13B. In the case where the second layer 14c exists, the filled portion 34 is formed by the material being filled into regions of the opening 12b other than the region where the second layer 14c exists.

However, even in such cases, by using the embodiment, it is possible to reduce the amount of the material remaining in the opening interior compared to the case where the material is filled into the entire opening interior.

Eighth Embodiment

An eighth embodiment will be described using FIGS. 14A to 14E and FIG. 15.

FIGS. 14A to 14E and FIG. 15 are cross-sectional views of processes, showing a manufacturing method according to the eighth embodiment.

A process similar to FIG. 7A is implemented; and the first layer 12a that has the openings 12b and 12c is formed on the substrate 10 as shown in FIG. 14A.

The second layer 14a is formed as shown in FIG. 14B. At this time, the second layer 14a is formed to fill the openings 12b and 12c. The second layer 14a may be formed by STP. The film formation may be performed by other film formation methods such as PVD, CVD, spin coating, etc. When forming the second layer 14a, the excessive material that is deposited on the first layer 12a is removed by, for example, CMP.

As shown in FIG. 14C, the third layer 16a that has the opening 16b is formed. At this time, multiple openings 16b are made on the second layer 14a that fills the opening 12b; and one opening 16b is made on the second layer 14a that fills the opening 12c.

Processes similar to the processes shown in FIGS. 9B to 9E and FIG. 10A to FIG. 10C are implemented; and the air gap 16d, a third layer 16f, the fourth layer 18a, the opening 20f, the fifth layer 20d, the air gap 26b, the sixth layer 28a, the seventh layer 30a, and the opening 30b are formed as shown in FIG. 14D.

Figure 15:
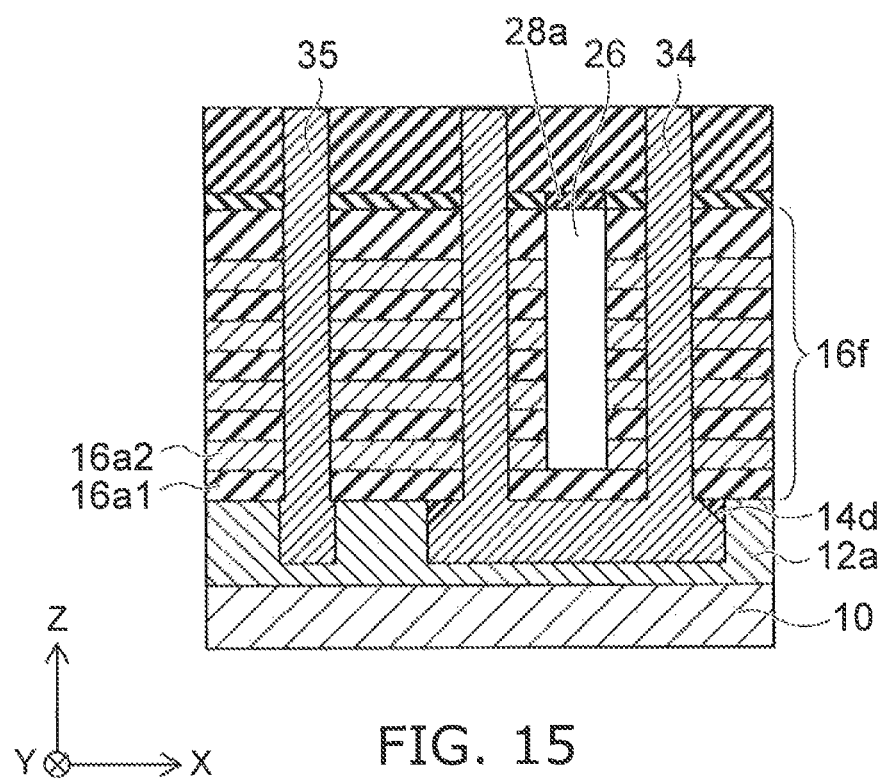

As shown in FIG. 14E, the opening 32 that is made of the opening 12b, the opening 16b, the opening 20f, and the opening 30b is made by removing the second layer 14a and the fourth layer 18a. At this time, a second layer 14d may be formed at the corner between the first layer 12a and the third layer 16 as shown in FIG. 15.

After the process shown in FIG. 14E, a process similar to the process shown in FIG. 10B may be implemented to form the filled portion 34 and the filled portion 35. The filled portion 34 and the filled portion 35 may be formed by stacking at least a first film including an insulating material and a second film including a semiconductor material. At this time, a gap 34c may be formed in the filled portion 34 as shown in FIG. 13A. The gap 34c may be arranged with the air gap 26b in the Z-direction.

According to the embodiment, the volume of the material that must be removed is less than in the case where the material is filled into the entire opening 16b, the entire opening 20f, and the entire opening 30b. Therefore, it is possible to perform the removal of the material in the opening interiors with a shorter processing time.

In particular, because the third layer 16f is a stacked film, the aspect ratio of the opening 16b provided in the third layer 16f is higher than the aspect ratios of the other opening 20f and/or opening 30b. In the case where the material is filled into the opening 16b interior, it is difficult to completely remove the material in the opening interior. According to the embodiment, because the layer is provided only at a portion inside the opening 16b, even in the case where the aspect ratio of the opening 16b is high, the removal of the material in the opening interior is easy; and it is possible to suppress the occurrence of the residue.

According to the embodiments described above, a method for manufacturing a semiconductor device capable of reducing residue at the bottom portions of openings can be realized. The embodiments described above can be used favorably to manufacture three-dimensional memory, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:
1. A method for manufacturing a semiconductor device, comprising:
transferring a continuous second layer onto a first layer, the first layer having a first opening, the second layer covering the first opening to form a first air gap;

forming a third layer on the first layer, the third layer having a second opening, the second opening being positioned on the first air gap; and removing at least a portion of the second layer through the second opening.

2. The method for manufacturing the semiconductor device according to claim 1, further comprising:

forming the second layer on a film, the second layer being transferred by pressing the first layer to the film.

3. The method for manufacturing the semiconductor device according to claim 2, wherein the second layer includes an insulating material.

4. The method for manufacturing the semiconductor device according to claim 1, wherein a portion of the second layer is provided in a portion of an interior of the first opening.

5. The method for manufacturing the semiconductor device according to claim 1, further comprising removing a portion of the second layer after transferring the second layer and prior to forming the third layer.

6. The method for manufacturing the semiconductor device according to claim 5, wherein a front surface of the first layer is exposed by removing the portion of the second layer.

7. The method for manufacturing the semiconductor device according to claim 5, wherein the portion of the second layer is removed so that a height of a front surface of the second layer provided in an interior of an opening of the first layer is equal to a height of a front surface of the first layer.

8. The method for manufacturing the semiconductor device according to claim 1, further comprising oxidizing the second layer after transferring the second layer and prior to forming the third layer.

9. The method for manufacturing the semiconductor device according to claim 1, further comprising nitriding the second layer after transferring the second layer and prior to forming the third layer.

* * * * *